(12) United States Patent
Cher et al.

(10) Patent No.: US 9,535,774 B2
(45) Date of Patent: Jan. 3, 2017

(54) METHODS, APPARATUS AND SYSTEM FOR NOTIFICATION OF PREDICTABLE MEMORY FAILURE

(71) Applicant: International Business Machines Corporation, Armonk, NY (US)

(72) Inventors: Chen-Yong Cher, Port Chester, NY (US); Carlos H. Andrade Costa, White Plains, NY (US); Yoonho Park, Chappaqua, NY (US); Bryan S. Rosenburg, Cortlandt Manor, NY (US); Kyung D. Ryu, New City, NY (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 14/022,180

(22) Filed: Sep. 9, 2013

(65) Prior Publication Data

US 2015/0074469 A1 Mar. 12, 2015

(51) Int. Cl.
*G06F 11/00* (2006.01)
*G06F 11/30* (2006.01)

(52) U.S. Cl.
CPC ......... *G06F 11/008* (2013.01); *G06F 11/3037* (2013.01); *G06F 11/3058* (2013.01)

(58) Field of Classification Search
CPC .............. G06F 11/3037; G06F 11/3409; G06F 11/3034; G06F 11/3058; G06F 11/004; G06F 11/008
See application file for complete search history.

(56) References Cited

U.S. PATENT DOCUMENTS

| 6,000,021 A * | 12/1999 | Saito et al. ................... 711/163 |
| 6,970,997 B2 | 11/2005 | Shibayama et al. |
| 2007/0006048 A1 | 1/2007 | Zimmer et al. |
| 2013/0138419 A1* | 5/2013 | Lopez et al. .................... 703/21 |
| 2013/0326284 A1* | 12/2013 | Losh et al. ................... 714/47.2 |
| 2014/0136915 A1* | 5/2014 | Hyde et al. ................... 714/747 |

FOREIGN PATENT DOCUMENTS

JP 2012234321 A 11/2012

\* cited by examiner

*Primary Examiner* — Jason Bryan
(74) *Attorney, Agent, or Firm* — Daniel P. Morris, Esq.; Otterstedt, Ellenbogen & Kammer, LLP

(57) ABSTRACT

A method for providing notification of a predictable memory failure includes the steps of: obtaining information regarding at least one condition associated with a memory; calculating a memory failure probability as a function of the obtained information; calculating a failure probability threshold; and generating a signal when the memory failure probability exceeds the failure probability threshold, the signal being indicative of a predicted future memory failure.

20 Claims, 3 Drawing Sheets

METHODS, APPARATUS AND SYSTEM FOR NOTIFICATION OF PREDICTABLE MEMORY FAILURE

STATEMENT OF GOVERNMENT RIGHTS

This invention was made with Government support under Contract No. B599858 awarded by the Department of Energy. The Government has certain rights in this invention.

BACKGROUND OF THE INVENTION

The present invention relates generally to the electrical, electronic and computer arts, and, more particularly, to methods, apparatus and systems for memory failure notification.

In high performance computing (HPC), uncorrected errors in the main memory ("memory") of the computer are one of the main reasons HPC systems crash or fail. For example, uncorrected errors may cause a crash due to an unrecoverable corruption of an operating system of the HPC system or an application running on the HPC system, which then may require the system or application to be restarted. After the crash, sometimes the application may resume from a predefined checkpoint.

A machine check is one way in which system hardware may indicate an internal error. Machine check handlers have been used to signal to the operating system the occurrence of memory parity check errors encountered by a memory controller and that cannot be corrected by a memory protection mechanism, such as Error-Correcting Codes (ECC), for instance. The memory controller also accounts for corrected and harmless errors. Corrected and harmless errors are errors that do not generate a machine check exception. As is well known by those skilled in the art, a machine check exception occurs when an error cannot be corrected by the hardware and in turn signals a machine check handler. Corrected and harmless errors may typically be tracked. Logs of corrected errors and the monitoring of a corrected error count compared to static thresholds have been used in proactive HPC system failure avoidance.

BRIEF SUMMARY

Principles of the invention provide techniques for the notification of predictable memory failure. In one aspect, an exemplary method includes the steps of obtaining data of one or more conditions of a memory; calculating a memory failure probability based on the obtained data; calculating a failure probability threshold; and generating a signal when the memory failure probability exceeds the failure probability threshold, the signal being indicative of a future memory failure.

In another aspect, an exemplary apparatus is provided. The apparatus includes a memory; one or more sensors coupled to the memory operative to obtain data; and at least one processor coupled to the memory and operative to: calculate a memory failure probability based on the obtained data; calculate a failure probability threshold; and generate a signal when the memory failure probability exceeds the failure probability threshold, the signal being indicative of a future memory failure.

In another aspect, a computer program product is provided. The computer program product includes a computer readable storage medium having computer readable program code embodied therewith. The computer readable program code includes computer readable program code configured: to obtain data of one or more conditions of a memory; to calculate a memory failure probability based on the obtained data; to calculate a failure probability threshold; and to generate a signal when the memory failure probability exceeds the failure probability threshold, the signal being indicative of a future memory failure.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, one or more embodiments may provide one or more of the following advantages:

Exposition of information about health degradation processes before a fault pattern leading to an unrecoverable error develops;

Interpretation of a corrected error rate variation based on memory health assessment;

Provisioning of information about imminent failure to the operating system, enabling proactive adaptation before an uncorrectable error occurs; and Support for an application's notification about imminent failure, allowing the application to take proactive fault-handling actions at an application-level.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

Figure 1:
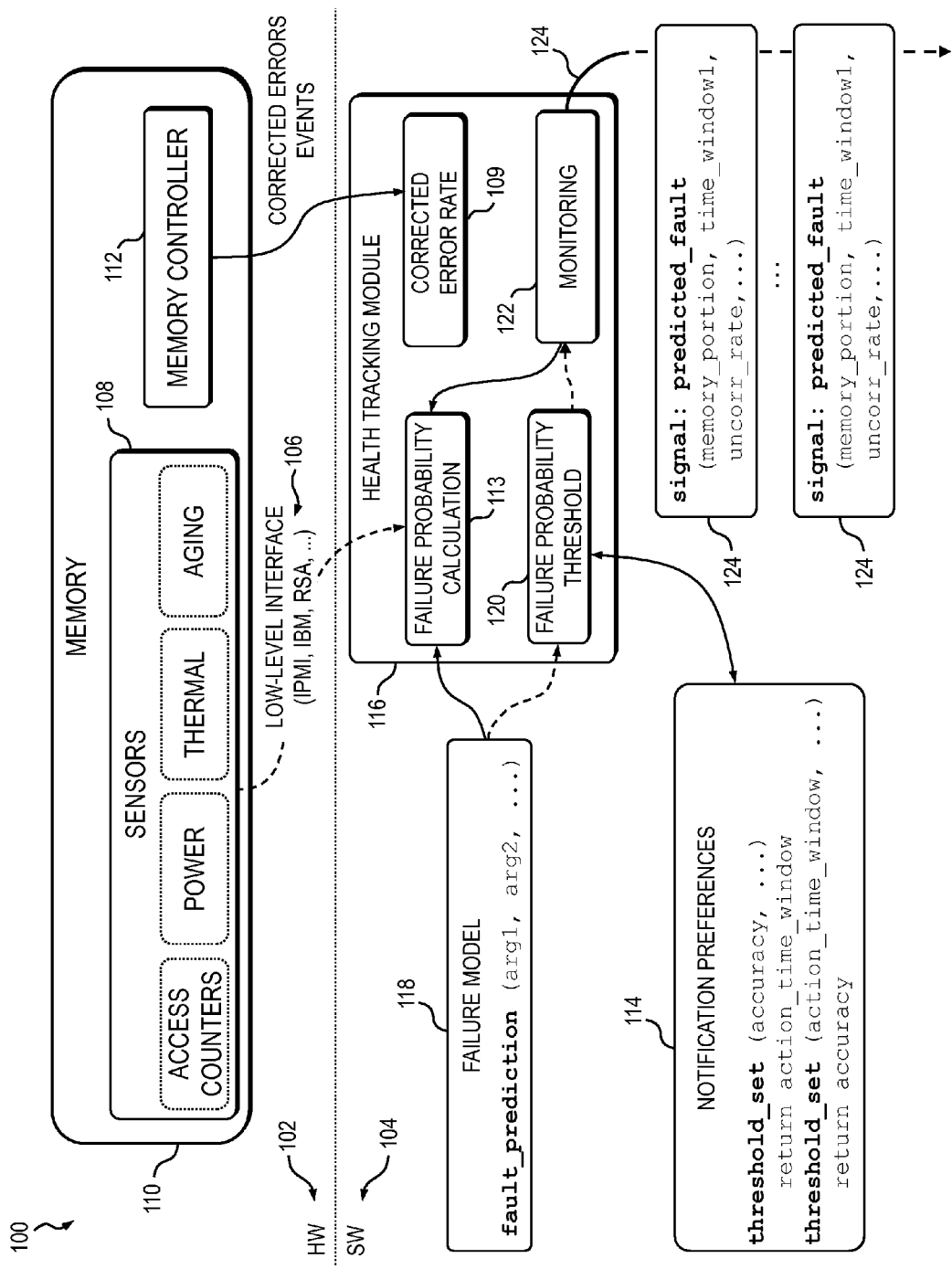
FIG. 1 is a block diagram depicting details of an exemplary system, according to an aspect of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments of a computing system and method for providing notifications of predictable memory failure. It is to be appreciated, however, that the invention is not limited to the specific apparatus and/or methods illustratively shown and described herein. Moreover, it will become apparent to those skilled in the art given the teachings herein that numerous modifications can be made to the embodiments shown that are within the scope of the claimed invention. Thus, no limitations with respect to the embodiments shown and described herein are intended or should be inferred.

As previously stated, uncorrected errors in the memory of high performance computers (HPCs) are one of the main causes of HPC system crashes, where the system or application may need to be restarted. In addition to uncorrected memory parity check and other errors, a memory controller may account for corrected and harmless errors, and store this information in the form of error logs in some storage means. Error logs and the monitoring of a corrected error rate and its comparison to a static threshold have been used to proactively avoid system failure or crashing; the terms "system failure" and "system crash" are used synonymously herein. However, the absolute rate of corrected memory errors, which may be determined from corrected error monitoring, is not a direct indication of a probable future memory failure, since memory failure is typically a dynamic function of one or more characteristics, including, but not limited to, manufacturing variation, surrounding conditions (e.g., temperature, supply voltage, etc.) and workload phases. For example, the shift in a threshold voltage of complementary metal-oxide-semiconductor (CMOS) transistors, which are often used in memory, may vary widely among individual semiconductor chips before they are deployed to the field due to manufacturing process variations, including variations in semiconductor oxide thickness, effective channel length and/or width of semiconductor transistors, and burn-in tests using higher voltages and/or temperatures.

Another technique used to indicate the probability of memory failures is health monitoring. Health monitoring is a technique that relies on capabilities sometimes found in commodity and HPC components that provides sensor information which indicates memory and surrounding conditions. The data obtained by the sensors may be used to detect or indicate, for example, electromigration (EM), negative bias temperature instability (NBTI), positive bias temperature instability (PBTI), temperature-dependent dielectric breakdown (TDDB), and hot carrier injection (HCI), among other conditions. The correlation between the information received or obtained by the sensors is used, in accordance with one or more embodiments of the invention, to predict memory failure dynamically at runtime. In particular, when a corrected error rate increases and exceeds (e.g., crosses) a statistically-defined threshold, one or more of the above memory health degradation conditions can be detected. The interpretation of sensor data and the evaluation of a failure probability, in addition to corrected error monitoring, represents an important feature of one or more aspects of the invention.

These mechanisms—corrected error monitoring and health monitoring—have limited effectiveness as used in existing solutions. The lack of an interpretation of memory and surrounding conditions that change dynamically, such as, for example, aging rate due to fabrication variation and temperature, respectively, may limit the accuracy and applicability of existing failure anticipation mechanisms that are based solely on the monitoring of static error threshold crossing. Health monitoring has not been explored by standard approached in a way that fine-grained notifications can be generated for memory areas with an increasing probability of failure. Existing proactive failure detection mechanisms may also be highly tied to specific implementations and are not extensible to a general case. In addition, existing corrected error monitoring and health monitoring, individually, are generally not suitable for practical use at an operating system level in mechanisms to interact with the operating system's memory management to proactively avoid or manage the impacts of memory failures. The existing mechanisms lack sufficient granularity and failure modeling useful for real-time failure prediction. Additionally, these mechanisms lack a hardware-independent notification format and a way to define preferences for notification-triggering that allow the definition of a meaningful tradeoff between accuracy of the prediction of future failure and a predicted time frame for failure notification.

One or more embodiments of the invention provide a system, method and/or apparatus for notification of a future predictable memory failure. In one or more embodiments, techniques of the invention are applicable to dynamic random access memory (DRAM), although embodiments of the invention are not limited to DRAM. In particular, one or more embodiments provide for memory degradation notification at the operating system level of an HPC system for preventive notification of imminent or future memory failure. In this manner, actions can be taken to avert a system failure or crash. One or more embodiments of the invention rely on a combination of both health monitoring and corrected memory error monitoring (e.g., corrected errors with error-correcting code (ECC), although essentially any variation in the rate of corrected error events produced by a correction mechanism can be used as a first sign of health degradation that triggers a health evaluation) to generate a notification indicating an imminent memory failure. As used herein, an imminent memory failure can be broadly defined as a future memory failure. The timeframe for a failure to occur may be, in one or more embodiments, intrinsically associated with a prescribed prediction accuracy and the particular mechanism using the notification; such timeframe may depend on the application.

In one or more embodiments, techniques of the invention rely, at least in part, on the monitoring of sensors in the main memory of the HPC system at runtime to dynamically predict the likelihood of a failure occurring in one or more memory blocks at per-die or finer granularity, and the generating of a notification (e.g., using a signal) indicating an imminent memory failure. One or more embodiments provide inexpensive access to real-time corrected memory error events and reconcile the events with health monitors accessible through monitoring interfaces. In this manner, embodiments of the invention define a correlation between a corrected memory error rate increase, as determined from monitoring of corrected error events, and the likelihood of a memory failure, as determined from health monitoring systems or alternative sensing means. An increase in corrected error rate is considered, in one or more embodiments, a first sign of a potential future memory failure. An increase in corrected error rate can be caused, in some instances, by a faulty memory portion being accessed multiple times or an evolving degradation processes. Other suitable causations for an increase in corrected error rate may apply.

Additionally, by including a hardware-specific correlation function in a hardware-independent failure model implementation, embodiments of the invention help ensure that health monitor readings, notification settings and event notifications are performed in a simplified and extensible way, applicable to a wide range of scenarios. For example, hardware-independent failure models for a given memory technology can be used in distinct platforms, including distinct architecture and a memory controller. In accordance with one or more embodiments, notification preferences or settings enable controlling a tradeoff between the time (or time period) necessary for taking corrective actions before a failure occurs and the overhead of ensuring against a false positive. Embodiments of the present invention provide for early signs of memory failure in proactive operating system mechanisms to be used to avoid system failure.

In some embodiments, a health tracking module performs a method for notification of predictable failure in a memory or memory segment based on memory health deterioration. The module accesses hardware-specific health indicators (e.g., sensors) generating hardware-independent notification of memory health deterioration. The method includes monitoring corrected error rates, memory and conditions surrounding the memory, such as, for example, power, thermal and aging variations. Other suitable conditions may be monitored. The method monitors corrected error rate and uses health monitoring to calculate the probability of failure in the event an increasing corrected error rate is detected. The method also includes defining settings, via a configuration interface, for example, to be used in the calculation of a failure probability threshold for imminent failure notification. These settings may be a procedure to set either prediction accuracy of an imminent failure or an action time window before an unrecoverable error (i.e., failure). This procedure may return the action time window given a specified prediction accuracy, or a prediction accuracy given a specified action time window. Then, a failure probability threshold indicating imminent memory failure is calculated with a failure model applied to a specified prediction accuracy or action time window, as will be further described below. A hardware-independent signal on the event of the failure probability crossing the calculated threshold is then generated.

In one or more embodiments, a real-time corrected memory error rate is determined via memory error monitoring, and failure probability is determined based on known failure models. Then, a correlation is made between the corrected memory error rate, the probability of a memory failure and, and the failure probability threshold, which accounts for a predefined action time window or a prediction accuracy. When an increase in the corrected memory error rate is observed, a failure probability is evaluated based on the health sensors readings and failure models, and when a failure probability threshold is exceeded, a hardware-independent signal is triggered indicating the memory portion that is about to fail, an action time window of when this failure will occur, and, in some embodiments, the expected uncorrectable error rate after the failure occurs. The action time window may, in some embodiments, be based on the models described below. The expected uncorrectable error rate after the failure occurs is the rate of errors that cannot be corrected by the software (or hardware) after a system failure or crash. In some embodiments, the hardware-independent signal indicates a particular segment of the memory that is about to fail.

Figure 2:
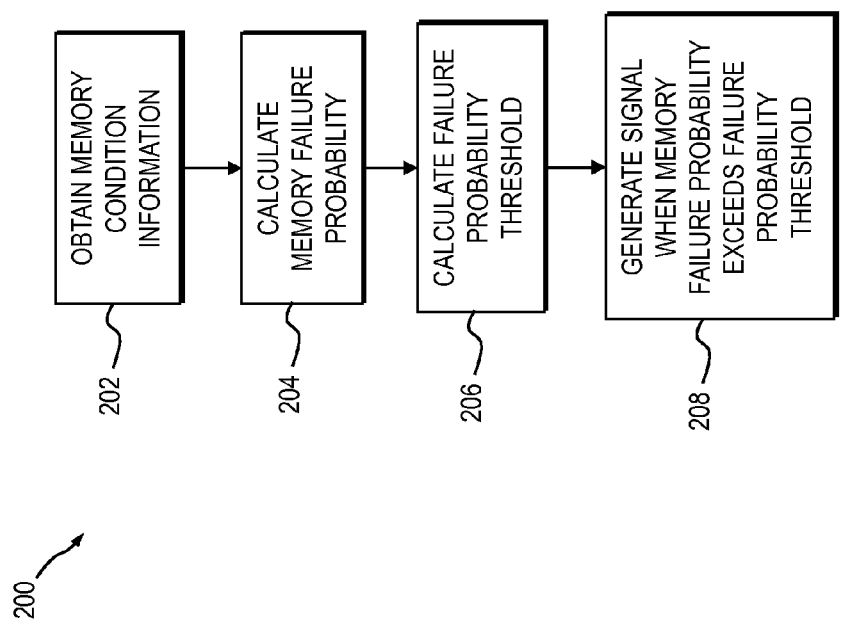
FIG. 2 is a flow chart depicting details of the operation of the system in FIG. 1, according to an aspect of the invention.

With reference now to FIGS. 1 and 2, at least a portion of an exemplary HPC system 100 is depicted in FIG. 1, with an illustrative flow diagram of method steps in a corresponding failure notification methodology 200 depicted in FIG. 2, according to one or more embodiments of the invention. The exemplary system 100 includes both hardware components (HW) 102 and software components (SW) 104. In some embodiments, an interface 106 is used to facilitate the interaction between the hardware components 102 and the software components 104. The interface 106 may be a low-level interface, such as, for example, an intelligent platform management interface (IPMI) or an IBM remote supervisor adapter (RSA) interface. Other suitable interfaces may also be used. The hardware components 102, in this embodiment, include a memory 110 and one or more sensors 108 operative to obtain information (i.e., detect) regarding conditions affecting the memory, or a segment thereof.

As described herein, the term "memory" may be used to indicate the memory as a whole or a particular segment thereof. Additionally, the memory 110 may comprise a standalone memory and/or an embedded memory. The memory 110 may comprise, for example, random access memory (RAM), such as, for instance, DRAM or static random access memory (SRAM). Other suitable memory types may also be used, including, but not limited to, content-addressable memory (CAM), phase change RAM (PCRAM), magnetic RAM (MRAM), etc. The memory 110 includes a controller 112 operative to control an operation of the memory 110.

The sensors 108 preferably reside proximate to the memory 110, and may be incorporated into the memory as shown in FIG. 1, although all or a portion of the sensors 108 may reside externally to the memory. The sensors 108 are operative to obtain information regarding one or more conditions affecting a performance of the system 100. For example, in one or more embodiments, the conditions sensed or detected by the sensors 108 include power, temperature and/or aging variations. Other conditions may be sensed or detected. In one or more embodiments, the sensors 108 comprise performance counters for tracking memory access patterns, (i.e., read/write operations). Sensors 108 may be configured to track other suitable memory conditions as well.

The software components 104, in this embodiment, include one or more failure models or tests 118, as will be described in further detail below, used in conjunction with information or data provided by the sensors 108 to determine the existence of a particular failure type for the memory 110 of a given hardware component 102 of the HPC system 100. The system 100, in some instances, also includes notification settings or preferences 114 (e.g., as may be embodied in a notification settings module, for example) that can be controlled by a user. The notification settings 114, as will be described further below, may be related to an action time window for when the imminent failure will occur or to a prediction accuracy of imminent failure.

In one or more embodiments, the software components 104 further include a health tracking module 116. The health tracking module 116, in this embodiment, includes a corrected error rate module 109, which is adapted to receive information from the memory controller 112 regarding corrected error events. The corrected error rate module 109, in some embodiments, is adapted to use this information to determine whether there is an increase in the corrected error rate. The health tracking module 116, in this embodiment, also includes a failure probability calculation module 113, which is adapted to receive information from one or more hardware components 102, such as from the sensors 108, and/or from one or more software components 104, such as one or more failure models 118, as will be described further below, and is operative to calculate a failure probability as a function of the received information. The health tracking module 116, in this embodiment, further includes a failure probability threshold module 120 which is adapted to receive information from one or more failure models 118 and notification preferences 114 to calculate a failure probability threshold as a function of the received information. The health tracking module 116, in this embodiment, further includes a monitoring module 122 operative to monitor one or more aspects of the system 100, and when the threshold calculated by the threshold module 120 is exceeded (or otherwise crossed), the health tracking module 116, in some instances, generates one or more signals 124 indicative of an imminent memory failure for the memory 110 as a whole, or a particular segment thereof.

In operation, in one or more embodiments, a method 200 is provided for memory degradation notification for preventive notification of imminent memory failure to an operating system. With reference to FIG. 2, in step 202, data concerning one or more conditions of the memory 110 is collected. The data may be collected by the sensors 108, as previously described in connection with FIG. 1. In one or more embodiments, the data may be obtained in real-time. Conditions surrounding the memory 110 and health indicators (e.g., parameters measured by a NTBI sensor, or other sensors, as described in the table further below) are accessed or polled, via the sensors 108, at prescribed times and/or during prescribed time intervals, through the monitoring interface 106. The frequency with which data regarding memory conditions is obtained may be controlled as a function of how often variations in a corrected error rate per a corrected error rate module 109 or conditions relating to the memory 110 and/or system 100 change; for example, changes due to power efficiency optimization, etc., although other suitable changes may also apply. In one or more embodiments, the health tracking module 116 polls the sensors 108, at a particular time or during prescribed (e.g., regular or irregular) intervals, to obtain the data. Data obtained by the sensors 108 is sent to the health tracking module 116 for further processing.

In one or more embodiments, an observed corrected error rate increase per the corrected error rate module 109 is evaluated with a health assessment by the health tracking module 116, and a memory failure probability based at least in part on the collected sensor data is calculated in step 204 with a memory failure probability module 113. The calculated memory failure probability may also be referred to herein as the probability of the occurrence of an uncorrectable error. Calculation of the failure probability in step 204 may, in one or more embodiments, be performed by the health tracking module 116. This calculation may involve, in some embodiments, determining a fault prediction function that relates the sensor data, such as memory performance patterns, power and temperature variations, and aging indicators, to the probability of a memory failure occurring in a specified memory area as a function of time.

In one or more embodiments, the fault prediction function is a hardware-specific function, although the invention is not limited to using a hardware-specific function. In some instances, for example, the fault prediction function is based on a hardware-dependent model for memory failure rate. In one or more embodiments, the failure rate is defined as a prediction of the number of memory failures over a prescribed amount of time, which may be referred to as a failure-in-time (FIT) rate. The failure rate may also be referred to as the mean-time-between-failure (MTBF) rate, which is calculated as the reciprocal of the FIT rate (i.e., MTBF=1/FIT).

The fault prediction function, in one or more embodiments, is used in the calculation of a failure probability threshold in step 206, which in turn is used in the triggering or generation of a notification of memory health deterioration. More particularly, in step 206, the failure probability threshold is calculated. As described above, an observed corrected error rate increase is evaluated with a health assessment via the health tracking module 116, which calculates a failure probability based on real-time sensors reading. User-provided settings (e.g., accuracy of prediction) are used to calculate a failure probability threshold. In the event a failure probability exceeds this threshold, the notification is sent. The failure probability threshold calculation performed in step 206, in one or more embodiments, is based at least in part on a failure model (e.g., 118 in FIG. 1) and notification settings or preferences (e.g., 114 in FIG. 1). Certain failure models/tests use the sensor data to determine whether a given failure type will occur.

In step 208, a signal (e.g., one or more signals 124 in FIG. 1) is generated when the memory failure probability, calculated in step 204, exceeds the failure probability threshold, calculated in step 206, to thereby indicate an imminent or future memory failure. The signal (or signals) generated in step 208 can be used by the HPC system to take corrective action(s) for averting a system failure or crash.

As described above with reference to FIG. 1, various hardware components 102 of an HPC system 100 have individual memories 110. Each of these hardware components may be subject to various types of failures, which may be determined through a particular failure model or test. The failure types may include, but are not limited to, NBTI, PBTI, EM, TDDB, and HCI, among other failure mechanisms. In one or more embodiments, each failure type associated with a particular hardware component has its own equation for the FIT rate.

In some instances, when multiple hardware components are involved, their respective FIT rates are combined (e.g., summed) to represent the larger domain of the HPC system which includes these multiple components. In other instances, when redundant hardware components are built into the HPC system, a minimum FIT rate of all of the redundant hardware components is used to represent the FIT rate of the overall HPC system. With respect to the FIT rate, according to one or more embodiments, HPC systems with spare hardware components may be handled in a manner consistent with an HPC system having redundant hardware components, except that the utilization of the spare hardware components is conditioned on the FIT rate of the primary components. In other words, if the HPC system has built-in spare parts, the lifetime of the system is accounted for in the FIT rate of the spare parts. In some embodiments, when a hardware component is subject to multiple failure types, the FIT rate for each failure type can be calculated independently, and the overall FIT rate for the hardware component is calculated by summing the respective FIT rates of each failure type. In some instances, examples of systems of multiple components include a dual in-line memory module (DIMM), memory ranks and banks, or memory domain covered by a particular interconnect or memory controller. The FIT rate of a system may be calculated on its components and failure types.

Below is a table of exemplary failure types, the hardware components that may be afflicted by the given failure type, the type of sensor data associated with the given failure type, and the failure models/tests that use the data to determine whether the given failure type will occur.

| Failure Type | Models/Tests | Sensors | Example components |
|---|---|---|---|
| NBTI/PBTI | Reaction-Diffusion (RD) Model | Aging (typically implemented as ring oscillator), temperature sensors, measurements on shift in threshold voltage over time, voltage (power), critical path monitor (CPM) | Transistors-based circuitry processing components, CPUs, interconnect, flip-flops, latches, memory controllers, storage elements such as SRAM, EDRAM, DRAM. |
| EM | Black's Equation | Current density (power), temperature, voltage. | Metal-based Interconnect including via, through-silicon via, C4 solder bump |
| TDDB | charge-to-breakdown test (QBD) | Performance counters, voltage | Same as NBTI's |
| HCI | Hot Carrier Injection tests (e.g., channel hot-electron injection; drain avalanche hot carrier injection; secondarily generated hot electron injection; substrate hot electron/hole injection) | Write cycles used, threshold voltage, CPM, aging, voltage | Same as NBTI's |

The following expression summarizes failure type dependency on monitored parameters or conditions sensed by the sensors and provides an example of how these parameters are used in the calculation of a FIT rate γ of a memory area A:

$$\gamma_A(a,T,V,\delta_{V_t},J,\text{read},\text{write}) = \text{NBTI} + \text{EM} + \text{TDDB} + \text{HCI},$$

where NBTI=f(a,T,$\delta_{V_t}$,V), EM=f(J,V,T), QBD=f(read,write, V), and HCI=f(write,V). The FIT rate depends on how each failure type impacts A. Each failure type is described as a function of the set of parameters indicated in the table, where a represents the aging indicator, T represents absolute temperature, $\delta_{V_t}$ represents threshold voltage variation, V represents voltage, J represents current density, read represents read cycles, and write represents write cycles. The expanded functions are those indicated in the models/tests column, for which constants are determined for specific hardware through empirical modeling.

In some embodiments, the notification preferences or settings 114 used in the threshold calculation (step 206 in FIG. 2) include an indication of an action time window or an indication of an accuracy of the predicted imminent memory failure notification. In some embodiments, the indication may be user selectable. The indication of an action time window implies an expected accuracy, and vice versa. Threshold calculation based on accuracy relies on a reliability function, R(t), for memory area A, which determines the probability of no failure occurring before time t. The reliability function can be written in terms of the FIT rate γ and failure distribution f(t), as R(t)$_A$=f(t)/γ$_A$. An expected accuracy φ implies an expected time-frame $t_\phi$ before the failure:

$$\phi = 1 - R(t)_A = \frac{f(t)}{\gamma_A} \to t_\phi = t_0, t.$$

Conversely, the indication of the action time window implies an expected accuracy for the failure prediction:

$$t_\phi \to \phi = 1 - R(t_\phi)_A = 1 - f(\phi)/\gamma_A.$$

With continued reference to FIGS. 1 and 2, in step 208, a notification signal 124 is generated when the memory failure probability, calculated in step 204, exceeds the failure probability threshold, calculated by the threshold calculation module 120 (step 206), to indicate an imminent or future memory failure. In other words, the health tracking module 116, in one or more embodiments, uses the calculated threshold to monitor (e.g., using monitoring module 122) the failure probability, thereby generating the signal 124 in the event the calculated failure probability threshold is crossed. The signal 124 indicates the memory area or range to be affected by the memory failure and the predicted or expected action time window before the failure occurs. In some embodiments, the failure prediction model can also be used to determine an expected uncorrectable error rate after a failure occurs. The generated signal 124 may also indicate this expected uncorrectable error rate after the failure.

Conventionally, the failure types described in the table above and associated sensors have had limited in-field usage, and limited correlation with in-field usage, including frequency/voltage scaling. In some embodiments, the present invention provides for calibrating the failure type models/tests with in-field empirical measurements, obtained from sensors or other means, to accommodate and adjust for process variation in hardware components during manufacturing and dynamic usage of the hardware components in the field. In-field sensors may empirically measure the effects of manufacturing process variation and in-field workload (e.g., changing of utilization and dynamically scaled operating voltages and frequencies of individual components). By using the sensors 108 to measure attributes of the failure models (e.g., power, temperature and/or aging variations, and memory access patterns, as described above) dynamically on a per-chip basis or even within the chip, the failure rates of individual chips, or components within a chip, can be more accurately predicted, and the failure prediction can be made available to the health tracking module 116 for use in the generation of a signal 124 indicative of an imminent failure.

Given the discussion thus far, it will be appreciated that, in general terms, an exemplary method, according to an aspect of the invention, includes the steps of obtaining data of one or more conditions of a memory; calculating a memory failure probability based on the obtained data; calculating a failure probability threshold; and generating a signal when the memory failure probability exceeds the failure probability threshold, the signal being indicative of a future memory failure. The present invention further provides in some embodiments that obtaining data of one or more conditions in a memory further comprises obtaining at least one of access pattern, power, thermal and aging data of the memory. In some embodiments the data is collected in real-time.

The present invention provides, in one or more embodiments, for indicating a failure type, wherein the failure type is at least one of electro migration, negative bias temperature instability, positive bias temperature instability, temperature dependent dielectric breakage, and hot carrier injection.

The present invention further provides, in some embodiments, for defining settings to be used in the calculation of the failure probability threshold. In some embodiments, defining the settings further comprises setting one of: a prediction accuracy given a specified action time window before an unrecoverable error; or an action time window before an unrecoverable error given a specified prediction accuracy.

The present invention also provides, in one or more embodiments, that calculating the memory failure probability further comprises evaluating a failure model using the defined settings.

The present invention further provides, in some embodiments, that the generated signal is hardware-independent.

The present invention further provides, in one or more embodiments, that the calculation of the memory failure probability further comprises applying a failure model to one of a specified prediction accuracy or an action time window.

The present invention provides, in some embodiments, that calculating a memory failure probability further comprises determining a fault prediction function that relates obtained data to the probability of a memory failure occurring in a specified memory area as a function of time. In one or more embodiments, the fault prediction function is a hardware specific function that correlates a number of memory access read and write operations and the conditions in the memory as a function of time.

The present invention further provides, in one or more embodiments, observing a corrected error rate increase prior to calculating a memory failure probability.

The present invention provides, in some embodiments, that the data is collected for one or more segments of the memory, and the memory failure probability is calculated for each of the one or more segments of the memory.

The present invention provides, in one or more embodiments, that the signal includes parameters indicating at least one of a memory portion that is about to fail; an expected action time window before failure; and an expected uncorrectable memory error rate after failure occurs.

In one or more embodiments, the present invention provides a system, wherein the system comprises distinct software modules, each of the distinct software modules being embodied on a computer-readable storage medium, and wherein the distinct software modules comprise a health tracking module and a notification settings module; wherein: said signal generation of memory health deterioration is carried out by said health tracking module executing on at least one hardware processor; and said setting of one of a prediction accuracy or an action time window is carried out by said notification settings module executing on said at least one hardware processor.

The present invention provides, in some embodiments, an apparatus, comprising a memory, one or more sensors coupled to the memory operative to obtain data, and at least one processor coupled to the memory and operative: to calculate a memory failure probability based on the obtained data; to calculate a failure probability threshold; and to generate a signal when the memory failure probability exceeds the failure probability threshold, the signal being indicative of a future memory failure. The one or more sensors monitor at least memory performance patterns, memory power, thermal variations of the memory and/or aging variations of the memory. In one or more embodiments, the present invention further includes a fault prediction function operative to correlate the collected data to the memory failure probability.

The present invention provides, in one or more embodiments, multiple distinct software modules, each of the software modules being embodied on a computer-readable storage medium, and wherein the distinct software modules comprise a memory health tracking module and a notification settings module, wherein: the processor is operative: to generate notification of the deterioration of the health of the memory by executing the memory health tracking module; and to set one of a prediction accuracy and an action time window by executing the notification settings module.

The present invention provides, in some embodiments, a computer program product including a computer readable storage medium having computer readable program code embodied therewith, the computer readable program code comprising computer readable program code configured: to obtain data of one or more conditions of a memory; to calculate a memory failure probability based on the obtained data; to calculate a failure probability threshold; and to generate a signal when the memory failure probability exceeds the failure rate threshold, the signal being indicative of a future memory failure.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 3:
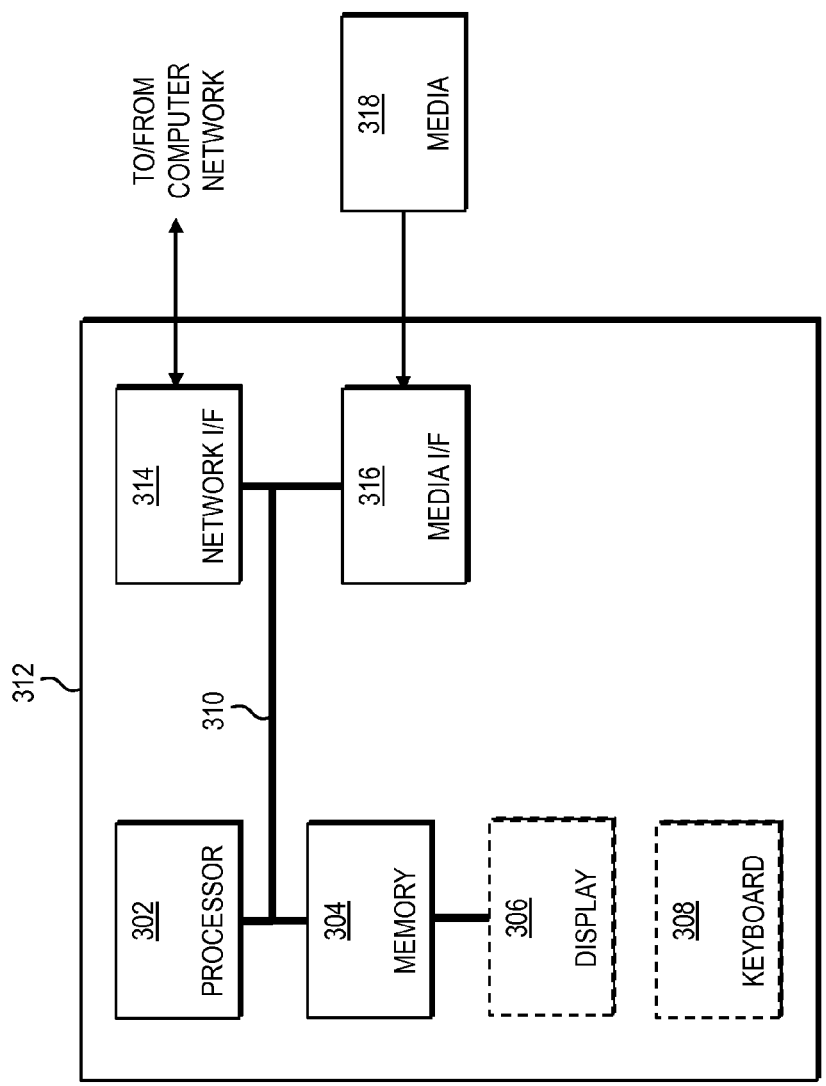
FIG. 3 depicts a computer system that may be useful in implementing one or more aspects and/or elements of the invention.

One or more embodiments can make use of software running on a general purpose computer or workstation. With reference to FIG. 3, such an implementation might employ, for example, a processor 302, a memory 304, and an input/output interface formed, for example, by a display 306 and a keyboard 308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 302, memory 304, and input/output interface such as display 306 and keyboard 308 can be interconnected, for example, via bus 310 as part of a data processing unit 312. Suitable interconnections, for example via bus 310, can also be provided to a network interface 314, such as a network card, which can be provided to interface with a computer network, and to a media interface 316, such as a diskette or CD-ROM drive, which can be provided to interface with media 318.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 302 coupled directly or indirectly to memory elements 304 through a system bus 310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 308, displays 306, pointing devices, and the like) can be coupled to the system either directly (such as via bus 310) or through intervening I/O controllers (omitted for clarity).

Network adapters such as network interface 314 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 312 as shown in FIG. 3) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 318 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a memory health tracking module, and a notification setting module. The method steps can then be carried out using the distinct software modules and/or sub-modules of the system, as described above, executing on one or more hardware processors 302. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuits (ASICs), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for providing notification of a predictable memory failure, the method comprising:
   obtaining information regarding at least one condition associated with a memory;
   calculating a memory failure probability as a function of the obtained information, the memory failure probability being defined as a probability of an occurrence of an uncorrectable error in the memory;
   calculating a statistically-defined failure probability threshold as a function of at least one memory failure model and user-controllable notification settings, the at least one memory failure model being matched to at least one of a plurality of memory failure types;
   generating a signal when the memory failure probability exceeds the failure threshold, the signal being indicative of a predicted future memory failure.

2. The method of claim 1, wherein obtaining the information regarding at least one condition associated with the memory further comprises obtaining at least one of access pattern, power, thermal and aging data corresponding to the memory.

3. The method of claim 1, further comprising obtaining the information regarding at least one condition associated with the memory in real-time.

4. The method of claim 1, further comprising indicating a failure type, wherein the failure type is at least one of electromigration, negative bias temperature instability, positive bias temperature instability, temperature-dependent dielectric breakdown, and hot carrier injection.

5. The method of claim 1, further comprising defining the user-controllable notification settings by one of: (i) setting a prediction accuracy given a prescribed action time window before an unrecoverable error; and (ii) setting an action time window before an unrecoverable error given a prescribed prediction accuracy.

6. The method of claim 1, wherein calculating the memory failure probability further comprises evaluating a failure model using the user-controllable notification settings.

7. The method of claim 1, wherein the generated signal is hardware-independent.

8. The method of claim 1, wherein calculation of the memory failure probability further comprises applying a failure model to at least one of a prescribed prediction accuracy and an action time window.

9. The method of claim 1, wherein calculating the memory failure probability further comprises determining a fault prediction function relating at least a subset of the obtained data to a probability of a memory failure occurring in a prescribed memory area as a function of time.

10. The method of claim 9, wherein the fault prediction function is a hardware-specific function that correlates a number of memory access read and write operations and the at least one condition associated with the memory as a function of time.

11. The method of claim 1, further comprising monitoring a corrected error rate, the memory failure probability being calculated in response to a variation in the corrected error rate.

12. The method of claim 1, wherein the information regarding at least one condition associated with the memory is obtained for one or more segments of the memory, and the memory failure probability is calculated for each of the one or more segments of the memory.

13. The method of claim 1, wherein the signal indicative of a predicted future memory failure comprises one or more parameters indicating at least one of a memory portion that is about to fail, an expected action time window before failure, and an expected uncorrectable memory error rate after failure occurs.

14. The method of claim 1, further comprising providing a system, wherein the system comprises distinct software modules, each of the distinct software modules being embodied on a computer-readable storage medium, and wherein the distinct software modules comprise a health tracking module and a notification settings module, and wherein the signal indicative of a predicted future memory failure is generated, at least in part, by said health tracking module executing on at least one hardware processor, and the failure probability threshold is calculated as a function of at least one of a prediction accuracy and an action time window supplied by said notification settings module executing on the at least one hardware processor.

15. An apparatus, comprising:
a memory;
at least one sensor coupled with the memory and operative to obtain information regarding at least one condition associated with the memory; and
at least one processor coupled with the memory and operative: to calculate a memory failure probability as a function of the obtained information, the memory failure probability being defined as a probability of an occurrence of an uncorrectable error in the memory; to calculate a statistically-defined memory failure probability threshold as a function of at least one memory failure model and user-controllable notification settings, the at least one memory failure model being matched to at least one of a plurality of memory failure types; and to generate a signal when the memory failure probability exceeds the failure probability threshold, the signal being indicative of a predicted future memory failure.

16. The apparatus of claim 15, wherein the at least one sensor monitors at least one of memory performance patterns, memory power, thermal variations of the memory and aging variations of the memory.

17. The apparatus of claim 15, wherein the at least one processor is further operative to calculate a fault prediction function for correlating the obtained information regarding at least one condition associated with the memory to the memory failure probability.

18. The apparatus of claim 15, further comprising a plurality of distinct software modules, each of the software modules being embodied on a computer-readable storage medium, the distinct software modules comprising a memory health tracking module and a notification settings module, wherein the at least one processor is operative: to generate notification of a deterioration in health of the memory by executing the memory health tracking module; and to set at least one of a prediction accuracy and an action time window by executing the notification settings module, the memory failure probability being a function of at least one of the prediction accuracy and the action time window.

19. A computer program product, comprising a non-transitory computer readable storage medium having computer readable program code embodied therewith, said computer readable program code comprising:
computer readable program code configured:
to obtain information regarding at least one condition associated with a memory;
to calculate a memory failure probability as a function of the obtained information, the memory failure probability being defined as a probability of an occurrence of an uncorrectable error in the memory;
to calculate a statistically-defined failure probability threshold as a function of at least one memory failure model and user-controllable notification settings, the at least one memory failure model being matched to at least one of a plurality of memory failure types;
to generate a signal when the memory failure probability exceeds the failure probability threshold, the signal being indicative of a predicted future memory failure.

20. The method of claim 1, further comprising calibrating the at least one memory failure model with in-field empirical measurements to thereby adjust for at least one of process variation in and dynamic usage of hardware components in the memory.

* * * * *